US006473013B1

(12) United States Patent
Velazquez et al.

(10) Patent No.: US 6,473,013 B1
(45) Date of Patent: *Oct. 29, 2002

(54) PARALLEL PROCESSING ANALOG AND DIGITAL CONVERTER

(76) Inventors: Scott R. Velazquez, 7042 Nighthawk Ct., Carlsbad, CA (US) 92009; Richard J. Velazquez, 6095 Wooddale Row, La Jolla, CA (US) 92037

( * ) Notice: Subject to any disclaimer, the term of this patent is extended or adjusted under 35 U.S.C. 154(b) by 0 days.

This patent is subject to a terminal disclaimer.

(21) Appl. No.: 09/997,563

(22) Filed: Nov. 29, 2001

Related U.S. Application Data

(63) Continuation of application No. 09/885,584, filed on Jun. 20, 2001.
(51) Int. Cl.[7] .................................................. H03M 1/00
(52) U.S. Cl. ....................... 341/120; 341/141; 341/144; 341/155; 341/118
(58) Field of Search .................... 341/118, 120, 341/126, 144, 155, 141

(56) References Cited

U.S. PATENT DOCUMENTS 5,568,142 A * 10/1996 Velazquez et al. .......... 341/126
6,177,893 B1 * 1/2001 Velazquez et al. .......... 341/118
6,339,390 B1 * 1/2002 Velazquez et al. .......... 341/120

OTHER PUBLICATIONS

Velazquez et al.; A Hybrid filter Bank approach to Analog-to-Digital Conversion; Proceedings IEEE Symposium on Time–Frequency and Time–Scale Analysis, 1994 IEEE; Oct. 1994; pp. 116–119.*

Oliaei; High–Speed A/D and D/A Converters Using Hybrid Filter Banks; 1998 IEEE International Conference on Circuits and Systems; Sep. 1998 Lisboa, Portugal; vol. 1, pp. 143–146.*

Oliaei; Asymptotically Perfect Reconstruction in Hybrid Filter Banks; Proceedings of the 1998 IEE International Conference on Acoustics, Speech and Signal Processing; May 1998 Seattle, WA.; vol. 3 pp. 1829–1832.*

* cited by examiner

Primary Examiner—Howard L. Williams

(57) ABSTRACT

In one aspect, the present invention is directed to a converter for converting a signal from a first format to a second format. The converter includes a decomposition section, a converter array operatively coupled to the decomposition section, and a recombination section operatively coupled to the converter array. The decomposition section includes an input to receive the input signal, a splitter to divide the input signal into a plurality of signals, a plurality of signal outputs, each of which provides as an output one of the plurality of signals, and a clock circuit having a plurality of clock outputs for providing sample clocks to the converter array. The converter array includes a plurality of converters each having a signal input to receive one of the plurality of signals, each having a clock input to receive one of the sample clocks and each having an output that provides a converted signal. At least one of the decomposition section and the recombination section includes filters for filtering one of the plurality of signals and the plurality of converted signals. Other aspects of the invention are directed to methods for generating and calibrating analog and digital converters.

13 Claims, 8 Drawing Sheets

PARALLEL PROCESSING ANALOG AND DIGITAL CONVERTER

RELATED APPLICATION

This application is a continuation application of U.S. Ser. No. 09/885,584, filed Jun. 20, 2001, the contents of which are incorporated by reference, in their entirety.

FIELD OF THE INVENTION

The present invention relates generally to a method and apparatus for providing signal conversion, and more particularly to a parallel processing method and apparatus for converting signals between digital and analog.

BACKGROUND OF THE INVENTION

The performance of analog and digital converters is typically quantified by two primary parameters, speed (in samples per second) and resolution (in bits). Designers of analog and digital converters typically face the challenge of trading off the resolution of a converter with its speed.

One type of prior art, high-speed analog-to-digital converter, is implemented using M time-interleaved, moderate speed, analog-to-digital converters (ADCs) configured in an array. In a typical time-interleaved converter, the M ADCs comprising the converter are triggered successively at a rate equal to 1/M times the effective sample rate of the overall converter. One drawback of time-interleaved converters is limited speed and resolution due to the sensitivity of these converters to mismatches between characteristics (including gain, phase and DC offset) of the M ADCs and due to clock timing errors.

A block diagram of a second type of prior art converter 10 is shown in FIG. 1. The converter 10 includes M analysis filters 12A–12D, M synthesis filters 14A–14D, M ADCs 16A–16D, M downsamplers 18A–18D, M upsamplers 20A–20D and an adder 22. The analysis filters 12A–12D partition a wideband input signal, u[n], into M narrow subband signals, which are downsampled by a factor M in the downsamplers 16A–16D. Each of the ADCs 16A–16D converts one of the subband signals from analog to digital. The upsamplers 20A–20D increase the sampling rate of the signals by a factor equal to M. The synthesis filters 14A–14D in combination with the adder 22 reconstruct the input signal in digital format. The frequency response for typical filters used as the analysis filters 12A–12D in the converter 10 are shown in FIG. 2.

One advantage of the converter 10 over the typical time-interleaved converters discussed above is an improvement in speed and resolution that can be achieved due to an attenuation in the effects of gain and phase mismatches between ADCs in the array of ADCs. In one prior art converter, disclosed in U.S. Pat. No. 5,392,044 to Kotzin et al., that utilizes the architecture shown in FIG. 1, a fully discrete-time quadrature mirror filter (QMF) (e.g., utilizing switched-capacitors) is used to implement the analysis filters 12A–12D. One drawback of this design is that the use of switched-capacitors limits the speed of the system and introduces switching noise which can limit the signal-to-noise ratio of the system. In addition, this converter is only capable of converting between discrete-time analog and discrete-time digital signals.

U.S. Pat. No. 5,568,142 to Velazquez et al., discloses a converter, having the architecture shown in FIG. 1, that overcomes some of the drawbacks of the converter disclosed by Kotzin et al. The converter disclosed by Velazquez et al. uses continuous-time analog analysis filters to feed each ADC in the converter and discrete-time digital synthesis filters to reconstruct the digitized signal. The primary drawbacks of this approach are that it uses high-order continuous-time analog filters with high stopband attenuation. Further, the converter disclosed in U.S. Pat. No. 5,568,142 is only capable of converting between continuous-time analog signals and discrete-time digital signals.

In addition to being concerned with the speed and resolution provided when selecting a converter architecture, designers of analog and digital converters are also typically concerned with the ease and accuracy of generating (or designing) and calibrating an analog and digital converter for a selected converter architecture. The ease and accuracy by which a specific analog and digital converter can be generated and calibrated is highly dependent on the architecture selected.

The discrete-time filter bank converter disclosed by Kotzin can be generated using standard digital filter bank generation techniques. However, disadvantages of these techniques are that round-off errors in implementing analog electronics in the converter can limit the resolution of the system, and the analog filters cannot typically be built with the same level of accuracy and precision of the digital filters, thereby limiting the performance of the system.

The converter disclosed by Velazquez et al. in U.S. Pat. No. 5,568,142 can be generated, as described in the patent, using an iterative optimization of the continuous-time filters followed by an iterative optimization of the discrete-time filters. The primary disadvantage of this approach is that it can be computationally intensive and is not guaranteed to converge to an accurate result.

Many prior art converters and other electronic systems are calibrated for peak performance by injecting a known test signal, measuring performance, and adjusting the electronics to correct for errors. Wideband pseudorandom signals have been used as calibration signal sources for electronic systems. The primary disadvantage of this calibration technique is that it can mask the magnitude and sources of individual errors and make it difficult to isolate and correct the individual errors.

The converter disclosed by Velazquez et al. in U.S. Pat. No. 5,568,142 can be calibrated, as described in the patent, by measuring the performance of subband signals followed by an iterative optimization of the digital filters to compensate for any errors detected. The primary disadvantages of this technique are that it is hardware intensive (since it requires measurement of each of the M subband signals), computationally complex and not guaranteed to converge to an accurate result.

It is desirable to provide an analog and digital converter that overcomes the drawbacks of the prior art discussed above.

SUMMARY OF THE INVENTION

Embodiments of the present invention are directed to methods and apparatus for providing analog and digital conversion that overcome drawbacks of the prior art discussed above. It should be noted that the term "analog and digital converter" as used herein includes analog-to-digital converters and digital-to-analog converters.

In one general aspect, the invention features a converter for converting an input signal from a first format to a second format. The converter includes a decomposition section, a converter array operatively coupled to the decomposition section, and a recombination section operatively coupled to the converter array. The decomposition section includes an input to receive the input signal, a splitter to divide the input signal into a plurality of signals, a plurality of signal outputs, each of which provides as an output one of the plurality of signals, and a clock circuit having a plurality of clock outputs for providing sample clocks to the converter array. The converter array includes a plurality of converters, each of the converters having a signal input to receive one of the plurality of signals, a clock input to receive one of the sample clocks and an output that provides a converted signal. At least one of the decomposition section and the recombination section includes filters for filtering either the plurality of signals or the plurality of converted signals.

The first format of the converter system can be analog, the second format can be digital, each of the converters of the converter array can be an analog to digital converter, and the recombination section can include a plurality of filters for filtering each of the converted signals. The clock circuit can be constructed and arranged to introduce a phase delay in at least one of the sample clocks The decomposition section can be constructed and arranged to receive as the input signal at least one of a continuous-time analog signal and a discrete-time analog signal. The recombination section can include a plurality of outputs that provide a plurality of converter output signals, each of the converter output signals being of the second format and corresponding to one of the plurality of output signals of the decomposition section. The recombination section can include an adder for combining a plurality of signals to create a converter output signal, wherein the converter output signal is of the second format and is representative of the input signal. The decomposition section can include a sampler that receives the input signal and provides an output sampled signal. The sampler can be constructed and arranged to operate on intermediate frequency data of the input signal. The recombination section can include a compensation section that corrects errors introduced into the converted signals by the converters in the converter array, and the compensation section can be adapted to correct errors introduced by the decomposition section. In the converter, the first format can be digital, the second format can be analog, each of the converters of the converter array can be a digital to analog converter, the decomposition section can include a plurality of filters for filtering each of the plurality of signals, and the recombination section can include a plurality of filters for filtering each of the converted signals.

In another general aspect, the invention features a method for generating a converter system that converts signals from a first format to a second format. The method can include steps of selecting converters for the converter system that convert signals from the first format to the second format, determining a value of residual mismatch error in the signals converted, and selecting filters for the converter system, having stopband attenuation characteristics based on the value of residual mismatch error. In the method, the filters can be selected such that the stopband attenuation of the filters is proportional to the value of residual mismatch error.

In another general aspect, the present invention features a method for generating a converter system that converts signals from a first format to a second format, wherein one of the formats is a continuous-time format. The method includes steps of selecting converters for the converter system that convert signals from the first format to the second format, and selecting continuous-time filters for the conversion system based on a transformation of discrete-time filters such that frequency responses of the continuous-time filters approximate that of the discrete-time filters. In the method, the transformation can be based on a ratio of polynomials.

In yet another general aspect, the present invention features a method of calibrating a system having an input to receive an input signal and an output that provides an output signal. The method includes steps of injecting a comb signal having selected frequency components into the input of the system, measuring performance of the system, and altering characteristics of the system based on the performance measured. The selected frequency components can be selected based on frequencies of predicted error signals of the system, such that the selected frequency components do not coincide with the frequencies of the predicted error signals.

The step of injecting can include a step of generating the comb signal such that the phase of each of the selected frequency components is not coherent with the phase of other selected frequency components. The system can be a converter system for converting a signal from a first format to a second format. The step of measuring performance can include a step of evaluating an output signal at the signal output of the system. The system can include a plurality of converters that generate a plurality of converted signals, and the step of measuring performance can include a step of evaluating the plurality of converted signals.

In another general aspect, the present invention features a method for converting an input signal from a first format to a second format. The method includes steps of receiving the input signal, splitting the input signal into a plurality of signals, generating a plurality of clock signals each having a clock period, converting the plurality of signals from the first format to the second format using a sampling rate determined by the clock period of the plurality of clock signals to produce a plurality of converted signals, and filtering either the plurality of signals or the plurality of converted signals or both.

In the method, the first format can be analog, the second format can be digital, and the step of converting can include a step of converting the plurality of signals from analog to digital. The method can further include a step of introducing a phase delay in at least one of the sample clock signals, such that the at least one of the sample clock signals has a phase that is delayed with respect to that of at least one other of the sample clock signals. The step of receiving can include a step of receiving at least one of a continuous-time analog signal and a discrete-time analog signal. The method can further include a step of combining the plurality of converted signals to create a converter output signal, wherein the converter output signal is of the second format and is representative of the input signal. The method can further include a step of sampling the input signal. The step of sampling can include a step of operating on intermediate frequency data of the input signal. The method can further include a step of correcting errors introduced into the converted signals during the step of converting. The step of correcting can include a step of correcting for errors introduced during the step of splitting. In the method, the first format can be digital, the second format can be analog, and the step of converting can include a step of converting the plurality of signals from digital to analog.

In another general aspect, the present invention features a method for generating a converter system that converts an input signal from a first format to a second format, the converter system including an analog processing section, a digital processing section, a clock skew circuit for providing a plurality of clock signals, and a plurality of converters to receive the plurality of clock signals and operatively coupled between the analog processing section and the digital processing section. The method for generating includes steps of selecting the converters, generating the analog processing section, setting a time skew between each of the plurality of clock signals, and selecting a frequency response of the digital processing section to provide an accurate representation of the input signal, wherein the step of setting a time skew includes determining the time skew such that the frequency response of the digital processing section for providing an accurate representation of the input signal is conjugate symmetric.

In another general aspect, the present invention features a method for generating a discrete-time analog processing section of a converter system. The method includes steps of utilizing a lossless factorization technique to generate multi-stage filters for use in the discrete-time analog processing section, and providing gain normalization factors between stages of the filters.

In still another general aspect, the present invention features a method for generating a converter system having a designated frequency range that converts an input signal from a first format to a second format, the converter system including an analog processing section, a digital processing section and a plurality of converters operatively coupled between the analog processing section and the digital processing section. The method for generating includes steps of selecting the converters, generating the analog processing section, and selecting a frequency response of the digital processing section such that aliasing errors are cancelled over the designated frequency range of the device.

The converter system generated by the method has a phase response, and the step of selecting a frequency response can include a step of setting the phase response of the converter system to be a linear phase response.

In another general aspect, the present invention features a method for generating a converter system that converts an input signal from a first format to a second format. The converter system includes an analog processing section, a digital processing section and a plurality of converters operatively coupled between the analog processing section and the digital processing section. The method includes steps of selecting the converters, generating the analog processing section, setting the delay of the converter system, and selecting a frequency response of the digital processing section to provide an accurate representation of the input signal. The step of setting the system delay includes determining the system delay such that the frequency response of the digital processing section for providing an accurate representation of the input signal is conjugate symmetric.

BRIEF DESCRIPTION OF THE DRAWINGS

For a better understanding of the present invention, reference is made to the drawings which are incorporated herein by reference and in which.

DETAILED DESCRIPTION

Figure 1:
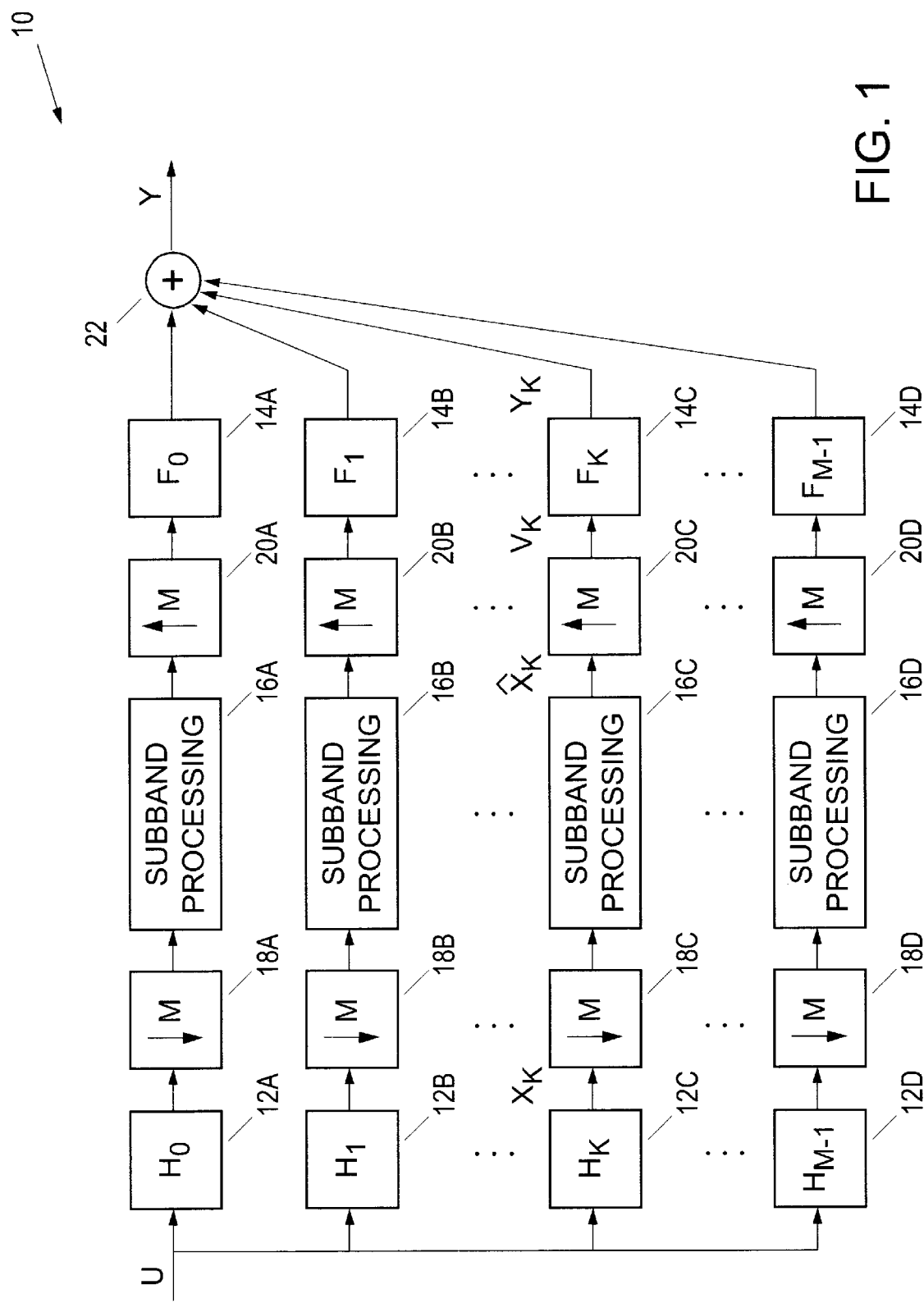
FIG. 1 is a block diagram of a prior art analog and digital converter.
Figure 2:
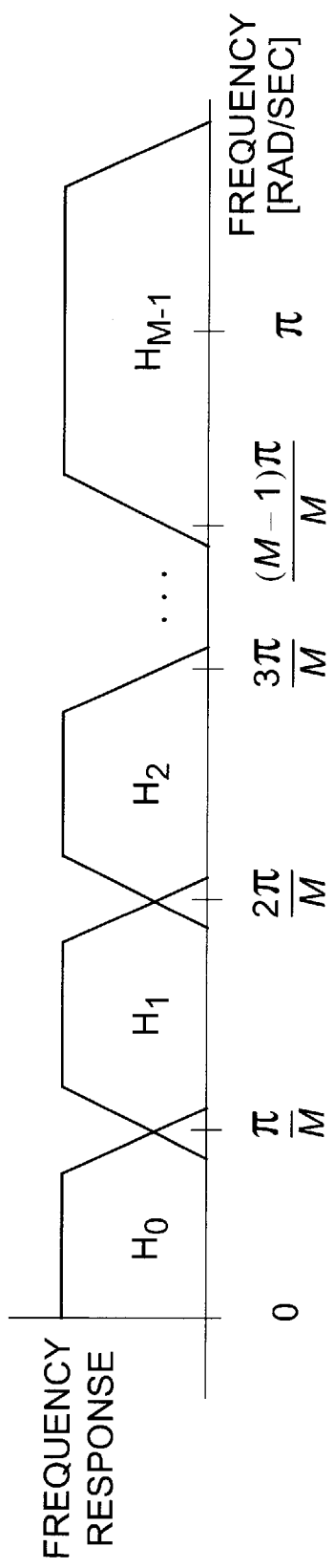
FIG. 2 is a graphical representation of the frequency response of typical filters used in the analog and digital converter of FIG. 1.
Figure 3:
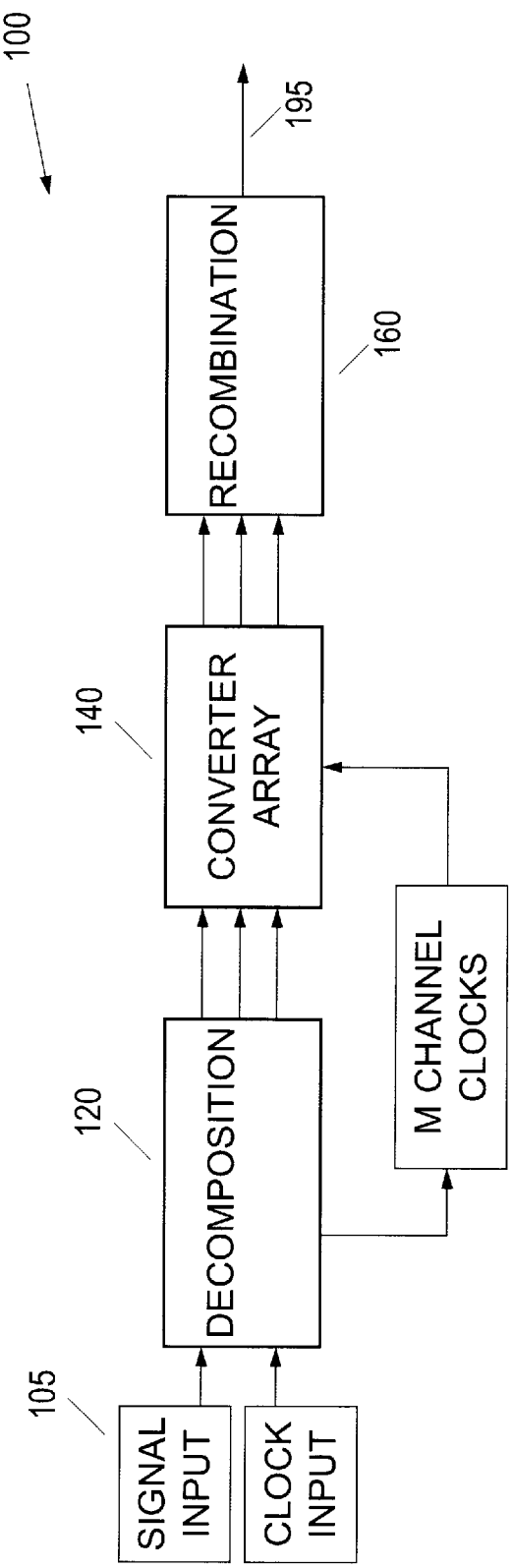
FIG. 3 is a block diagram of the architecture for an analog and digital converter in accordance with one embodiment of the present invention.

A block diagram of the basic architecture of an analog and digital converter 100 in accordance with one embodiment of the present invention is shown in FIG. 3. The analog and digital converter 100 provides for conversion of signals between any of the following formats: continuous-time analog, discrete-time analog, and digital. It can be used for analog-to-digital conversion, digital-to-analog conversion, or conversion between continuous-time and discrete-time analog. Continuous-time analog signals include analog signals which vary across a continuum of amplitude and a continuum of time, such as electrical voltage signals filtered with passive inductor-capacitor ladders. Discrete-time analog signals include analog signals which vary across a continuum of amplitude but at discrete points in time. Discrete-time analog signals are also known as sampled-analog, and include, for example, electrical voltage signals processed with active switched-capacitor filters and electrical charge signals processed with charge-coupled devices (CCD). Digital signals include signals that vary across discrete amplitudes at discrete points in time, such as streams of data stored and processed in a computer.

The analog and digital converter 100 includes a decomposition section 120, a converter array 140 and a recombination section 160. The converter array includes an array of signal converters, which may be analog-to-digital converters or digital-to-analog converters depending on the conversion function provided by converter 100. The use of an array of converters provides improved resolution and speed when compared with a single converter.

The decomposition section 120 is used to partition an input signal received at a signal input 105 into several signals each of which is subsequently converted using one of the converters of the converter array. The decomposition section has a clock input for receiving a clock signal and a clock output for providing clock signals to each of the converters in the converter array. In embodiments of the present invention, depending on the type of conversion being performed and depending on desired performance characteristics, the decomposition section may perform one or more of the following functions: sampling, amplitude and/or phase filtering, signal splitting/demultiplexing, converter clock dividing and skewing, signal rate changing, and compensation.

The recombination section 160 is used to recombine signals output by the converters in the converter array to created a converted version of the input signal. In embodiments of the present invention, again depending on the type of conversion being performed and depending on desired performance characteristics, the recombination section may perform one or more of the following functions: amplitude and/or phase filtering, signal combining (e.g. addition, multiplexing), error cancellation, signal rate changing, and compensation.

Figure 4:
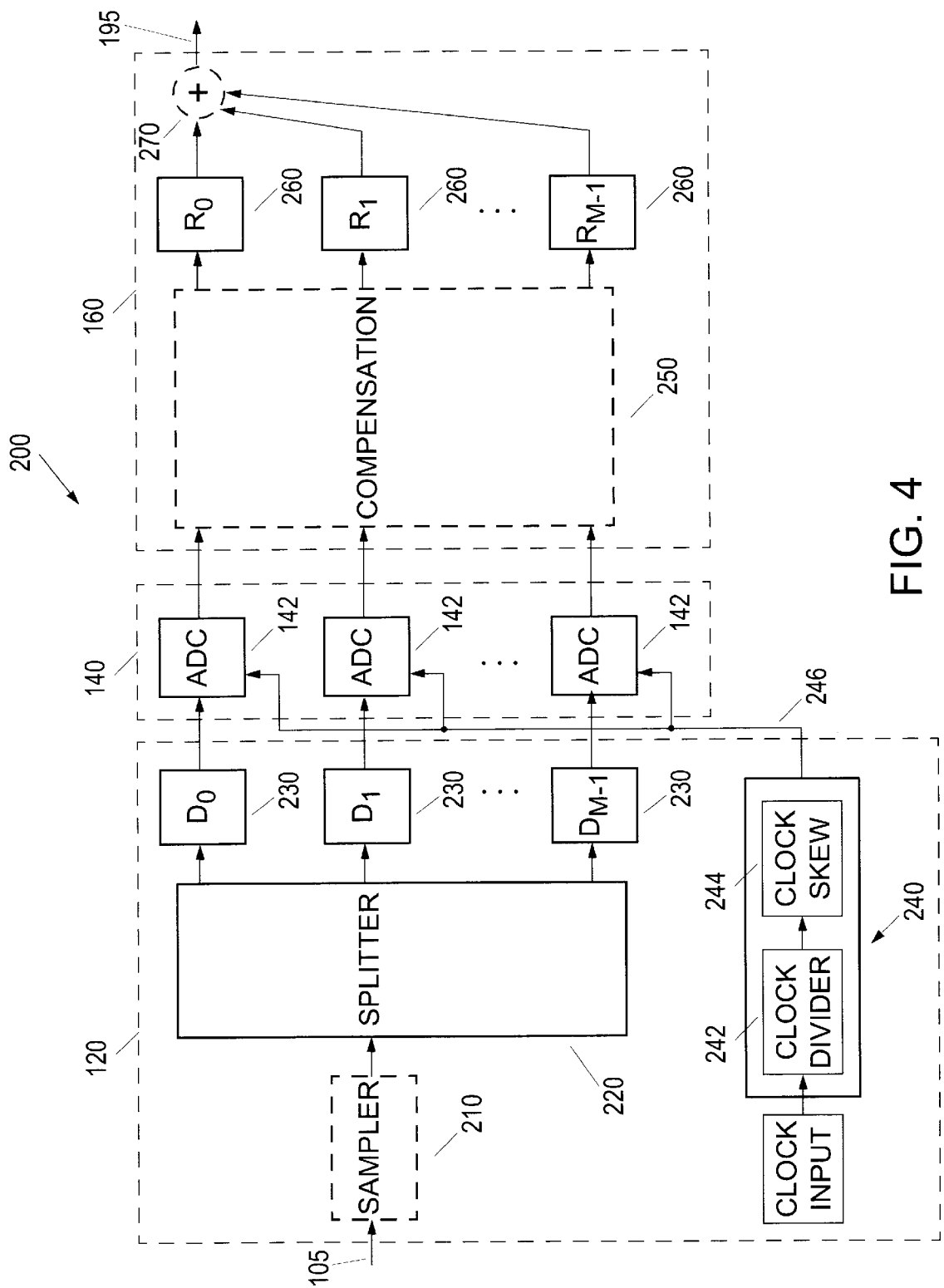
FIG. 4 is a block diagram of an analog-to-digital converter in accordance with one embodiment of the present invention.

A block diagram of one embodiment of an analog-to-digital converter 200 utilizing the architecture of FIG. 3 is shown in FIG. 4. In the analog-to-digital converter 200, the decomposition section 120 includes an optional sampler 210, a splitter 220, M optional filters 230 and a clock circuit 240 containing a clock divider 242 and a clock skew circuit 244.

The converter array 140 of the analog-to-digital converter 200 includes M ADCs, which in one embodiment may be implemented using conventional analog-to-digital converters, such as the Analog Devices AD6640.

The recombination section 160 of the analog-to-digital converter 200 includes an optional compensation circuit 250, multirate filters 260, and an optional adder 270.

In the case of analog-to-digital conversion, the decomposition section 120 processes continuous-time or discrete-time analog signals. The optional sampler 210 on the front-end of the decomposition section can be used to change a continuous-time analog signal into a discrete-time analog signal. With appropriate choice of sampling frequency, the front-end sampler can also move intermediate frequency (IF) components of the input signal to frequency ranges more suitable for accurate conversion (such as the baseband Nyquist zone).

The splitter 220 of the decomposition section 120 is used to accurately split the input signal into M signals suitable for conversion by the converters in the converter array 140. In embodiments of the present invention, the splitters can be implemented using, for example, impedance matching resistor networks, isolated splitters, or transformers.

The filters 230 of the decomposition section 120 are used to adjust the gain and/or phase of the signal, for example, to allocate a frequency band to each converter in the array and attenuate the effects of gain and phase mismatch errors or to introduce time delays. In embodiments of the invention, the filters can be implemented using, for example, passive inductor-capacitor ladder networks or active switched-capacitor filters.

The clock circuit 240 provides M sampling clock signals to the converter array so that each converter of the array receives a dedicated sampling clock signal. The clock circuit 240 includes a clock divider circuit 242 and a clock skew circuit 244. The clock divider circuit divides the input clock signal into M clock signals having a clock period equal to the desired channel sampling rate, and the clock skew circuit may be used to adjust relative phases of the M clock signals. The clock skew circuit is an optional circuit and is used in embodiments of the present invention to aid in the cancellation of error signals by adjusting the relative phases of the M sampling clock signals provided to the analog-to-digital converters.

In another embodiment of the present invention, rather than using M different clock signals to the ADCs, the same clock signal is provided to each of the ADCs and unique delays are added to each of the signals output by the filters 230 to achieve substantially the same effect as that provided by the clock skew circuit 244.

The converter array 140 of the analog-to-digital converter 200 consists of M analog-to-digital converters (ADCs), with a resolution of n bits, operating in parallel. In one embodiment, each ADC includes a sampler circuit to capture the amplitude of its input signal at discrete points in time. In this embodiment, to maximize the sample rate of the full system, the individual ADCs in the array are sampled at 1/M the effective sample rate of the full system. In other embodiments of the present invention, the resolution of the system is increased using oversampling by setting the sampling rate of each of the ADCs to be greater than 1/M the effective sample rate of the full system, and decreasing the effective speed of the full system. The sampled signal amplitudes are quantized by the ADCs to form n-bit digitized samples.

The recombination section 160 of the analog to digital converter 200 provides reconstruction of the digitized signals from the converter array. In one embodiment, the compensation circuit 250 includes digital adders that are used to subtract DC-offset errors that may be present in the output of each of the individual converters in the converter array 140. In embodiments of the present invention, the compensation circuit 250 may also include linearity compensation (e.g., static table look-up techniques or dynamic phase-plane techniques) to reduce harmonic distortion errors. The compensation circuit may also include rate changers to adjust the signal rate from the rate used by the converters in the array to the effective sample rate of the full system. For example, if the individual converters in the array are sampling at 1/M the effective sample rate of the full system, then digital upsamplers can be used to increase the rate by a factor of M to equal that of the system output. Upsamplers can increase the data rate by inserting M zero amplitude samples after each output of the converters in the array. In addition, in embodiments of the invention, the multirate filters 260 can be used to adjust the gain and phase of the signals, for example, to select an appropriate frequency band from aliasing images (caused by the upsampling) or to compensate for gain or phase mismatch errors. An optional digital adder 270 is used in the recombination section 160 to combine the signals to create the digitized output signal 195.

The transfer function and ideal reconstruction conditions for the analog to digital converter 200 will now be derived for a continuous time input signal $U(j\Omega)$ at the signal input 105. The transfer function of the filters/splitters (220 and 230) is represented by $D_k(j\Omega)$ and accordingly, the output $X_k(j\Omega)$ of the decomposition filters/splitters (220 and 230) is represented by equation (1).

$$X_k(j\Omega)=U(j\Omega)D_k(j\Omega) \tag{1}$$

For equation (1) the signal input 105 of the decomposition section 120 is assumed to be bandlimited to $\Omega_o$[rad/sec] or $f_o$[Hz] (where $f_o$ is equal to $\Omega_o/2\pi$). In embodiments of the present invention, the decomposition section may include either amplitude/phase filtering, using filters 230, or clock skewing, using clock circuit 240, or both. The transfer function $D_k(j\Omega)$ is used to account for the combined effects of amplitude/phase filtering and clock skewing. Downsampling (i.e. sampling by the A/D converter) followed by A/D conversion in the converter section 140 yields:

$$\hat{X}(e^{j\omega}) = \sum_{m=0}^{M-1} X_k(j(\omega - 2\pi m)/T) \tag{2}$$

In equation (2), $0 \leq \omega \leq (M-1)2\pi$, and T is the channel ADC sampling period, and is defined by equation (3):

$$T = \frac{M\pi}{\Omega_0} = \frac{M}{2f_0} \quad [\text{sec}] \tag{3}$$

In embodiments of the present invention, upsampling may occur in the multirate filters 260. The result of the upsampling is shown in equation (4):

$$V_k(e^{j\omega}) = \hat{X}(e^{j\omega M}) \tag{4}$$

In equation (4), $0 \leq \omega \leq 2\pi(M-1)/M$.

The transfer function of each of the recombination filters 260 is represented by $R_k(e^{j\omega})$, and the output of the recombination filters 260, $Y_k(e^{j\omega})$ is provided by equation (5):

$$Y_k(e^{j\omega}) = R_k(e^{j\omega})V_k(e^{j\omega}) \tag{5}$$

Based on the foregoing, the system output, $Y(e^{j\omega})$, is provided by equation (6):

$$Y(e^{j\omega}) = \sum_{k=0}^{M-1} Y_k(e^{j\omega}) \tag{6}$$

$$= \sum_{m=0}^{M-1} U(j(\omega M - 2\pi m)/T) \cdot$$

$$\sum_{k=0}^{M-1} R_k(e^{j\omega})D_k(j(\omega M - 2\pi m)/T)$$

In embodiments of the present invention, the decomposition filters/splitters (220 and 230) and recombination filters 260 are preferably designed such that the signal $Y(e^{j\omega})$ at the system output 195 is simply a scaled, delayed version of the input signal $U(j\Omega)$ at the signal input 105, and thus, the output signal $Y(e^{j\omega})$ is provided by equation (7):

$$Y(e^{j\omega}) = \sum_{m=0}^{M-1} U(j(\omega M - 2\pi m)/T)T_m(e^{j\omega}) \tag{7}$$

$$= Me^{-j\omega d}U(j\omega M/T)$$

In equation 7, d represents the system delay and $T_m(e^{j\omega})$ ($0 \leq m \leq M-1$) represents the distortion/aliasing function of the system and is provided by equation (8).

$$T_m(e^{j\omega}) = \sum_{k=0}^{M-1} R_k(e^{j\omega})D_k(j(\omega M - 2\pi m)/T) \tag{8}$$

$$= \begin{cases} Me^{-j\omega d} & m = 0 \\ 0 & m = 1, 2, \ldots, M-1 \end{cases}$$

In equation (8), $0 \leq \omega \leq 2\pi(M-1)/M$, $T_0(e^{j\omega})$ is the distortion function and corresponds to the gain and phase of the system, and, $T_m(e^{j\omega})$ ($1 \leq m \leq M-1$) is the aliasing function and corresponds to the aliasing and imaging errors in the system. Equation (8) corresponds to a "perfect reconstruction" condition, wherein there are no aliasing errors and imaging errors.

Figure 5:
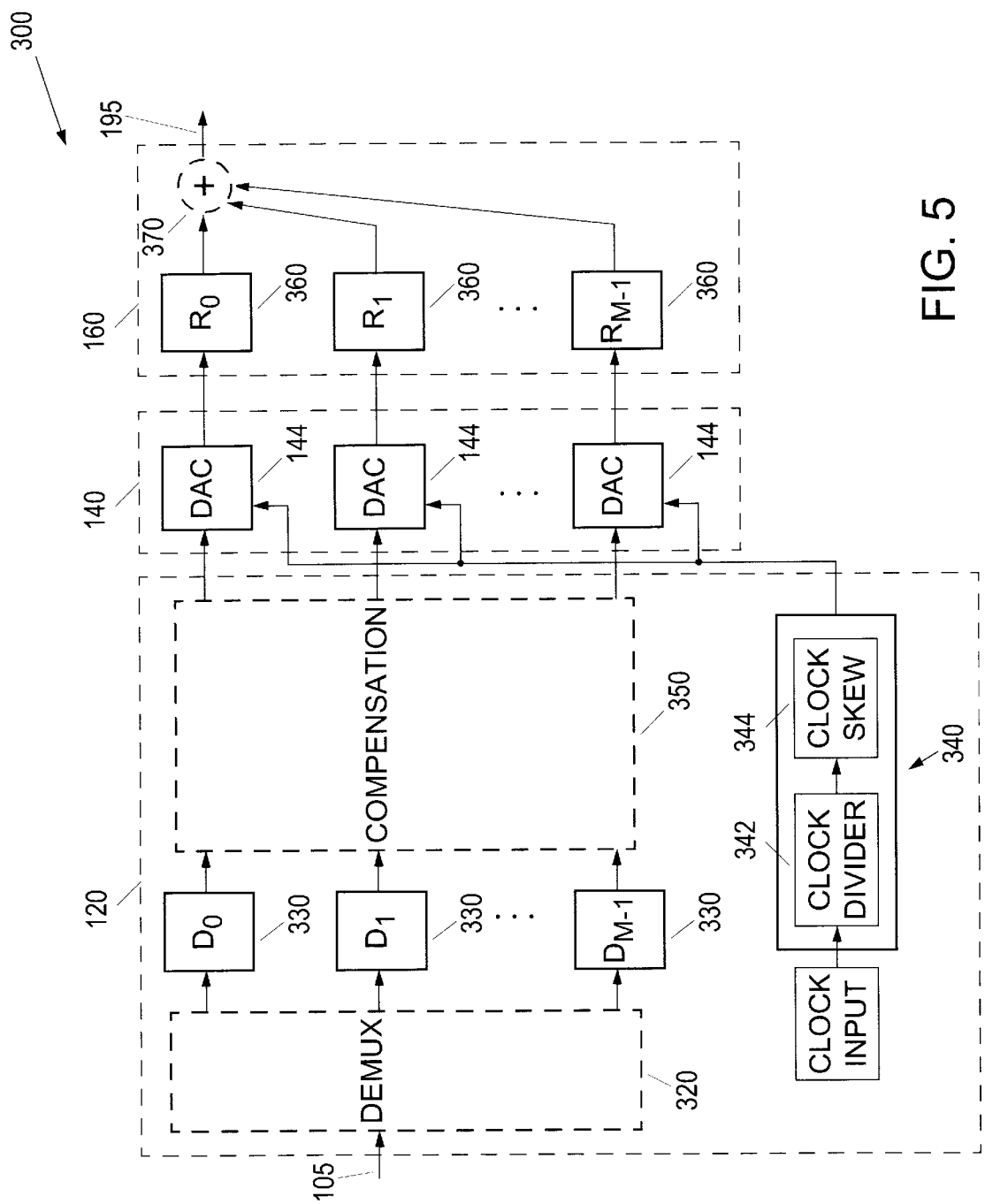
FIG. 5 is a block diagram of a digital to analog converter in accordance with one embodiment of the present invention.

A block diagram of one embodiment of a digital-to-analog converter 300 utilizing the architecture of FIG. 3, will now be described with reference to FIG. 5. In the digital-to-analog converter 300, the decomposition section 120 includes a demultiplexer circuit 320, M multirate filters 330, a compensation circuit 350 and a clock circuit 340 containing a clock divider 342 and a clock skew circuit 344.

The converter array 140 of the digital-to-analog converter 300 includes M DACs (digital-to-analog converters), which in one embodiment may be implemented using conventional digital-to-analog converters, such as the Harris Semiconductor HI5741. The recombination section 160 of the digital-to-analog converter 300 includes filters 360, and an adder 370.

The digital-to-analog converter 300 is essentially the reverse of the analog-to-digital converter 200. In the digital-to-analog filter, the signal input 105 of the decomposition section 120 is designed to receive and process digital signals. The demultiplexer 320 functions as a splitter to divide an input digital signal into M signals, one of which is provided to each of the multirate filters 230. The multirate filters 230 provide filtering of the M signals and are used to adjust the gain and phase of each of the M signals, for example, to allocate a frequency band to each converter in the array. The filters 230 are also used in embodiments of the invention to attenuate the effects of gain and phase mismatch errors, or to compensate for gain or phase mismatch errors. In embodiments of the present invention, the multirate filters may be implemented using finite impulse response (FIR) digital filters or infinite impulse response (IIR) filters.

The clock circuit 340 provides M sampling clock signals to the converter array so that each DAC 144 of the converter array 140 receives a dedicated sampling clock signal. The clock circuit 340 can be used in embodiments of the present invention to aid in the cancellation of error signals by adjusting the relative phases of the sampling clock signals provided to the analog-to-digital converters in a manner similar to clock circuit 240 of converter 200. In the embodiment of the digital-to-analog converter shown in FIG. 5, the clock circuit 340 includes a clock divider circuit 342 and a clock skew circuit 344. The clock divider circuit divides an input clock signal into M clock signals having a clock period equal to the desired channel sampling rate, and the clock skew circuit can be used to introduce a unique delay to each of the M clock signals.

In other embodiments of the present invention, rather than using M different clock signals to the DACs, the same clock signal is provided to each of the DACs and unique digital delays are added to each of the M signals output by the filters 330 to achieve substantially the same effect as that provided by the clock skew circuit 344.

The compensation circuit 350 in embodiments of the invention may include a number of different compensation circuits including digital adders, a linearity compensation circuit, and rate changers. The digital adders are used to subtract DC-offset errors that may be present in the outputs of each of the individual DACs in the converter array 140. The linearity compensation circuit is used to reduce harmonic distortion errors and may include, for example, static table look-up techniques or dynamic phase-plane techniques. Rate changers are used in the compensation circuit to adjust the signal rate from the input data rate to a rate used by the DACs in the array. For example, if the individual DACs 144 in the converter array 140 are operating at 1/M the effective sample rate of the full system, then digital downsamplers can be used in the compensation circuit to decrease the data rate of the signals to the converter array by a factor of M. In one embodiment of the invention, downsamplers can be used to decrease the data rate by repetitively retaining one sample and discarding the following M samples.

In the digital-to-analog converter 300, the converter array 140 consists of M digital-to-analog converters (DACs), each having a resolution of n bits, operating in parallel to convert the M digital input signals from the decomposition section into M analog signals. In embodiments of the present invention, to maximize the sample rate of the full system, the individual DACs in the converter array have a sampling rate equal to 1/M the effective sample rate of the full system. In other embodiments, the DACs in the converter array 140 have a sample rate greater than 1/M the effective sample rate of the full system, and the effective speed of the full system is decreased in order to increase resolution by oversampling.

The recombination section 160 of the digital-to-analog converter 300 provides reconstruction of the M analog signals from the converter array to generate an output analog signal at the signal output 195. In embodiments of the invention, the recombination section may include rate changers (not shown) at the input of the recombination section to adjust the signal rate of the M analog signals received from the converter array from the rate used by the DACs in the converter array to the effective sample rate of the full system. For example, if the individual DACs in the converter array are sampling at 1/M the effective sample rate of the full system, then sampled-analog upsamplers can be used to increase the sample rate by a factor of M. In one embodiment, the upsamplers increase the data rate by inserting M zero amplitude samples after each output of the DACs in the converter array.

The filters 360 in the recombination section of the digital to analog converter 300 are used to adjust the gain and/or phase of the M analog signals, for example, to select the appropriate frequency band from aliasing images (caused by the upsampling), whether it is the baseband Nyquist zone or a higher IF zone.

The adder 370 in the recombination section of the digital to analog converter 300 is used to combine the M analog signals into one analog signal at the signal output 195. In one embodiment, the adder is implemented using an analog multiplexer. In embodiments of the present invention, a discrete-time analog output signal can be obtained by, for example, using discrete-time analog filtering (e.g., switched-capacitors) for the filters 360. A continuous-time analog output signal can be obtained by, for example, using inductor-capacitor ladder filters for the filters 360 or by simply low-pass (or band-pass) filtering the sampled-analog output signal.

In other embodiments of the present invention, the converter architecture described above with reference to FIG. 3 can be used for continuous-time analog to discrete-time analog conversion (which may be useful in, for example, voltage-to-charge converters or sample-and-hold circuits), and the converter architecture can also be used for discrete-time analog to continuous-time analog conversion (which may be useful in, for example, charge-to-voltage converter).

Figure 6:
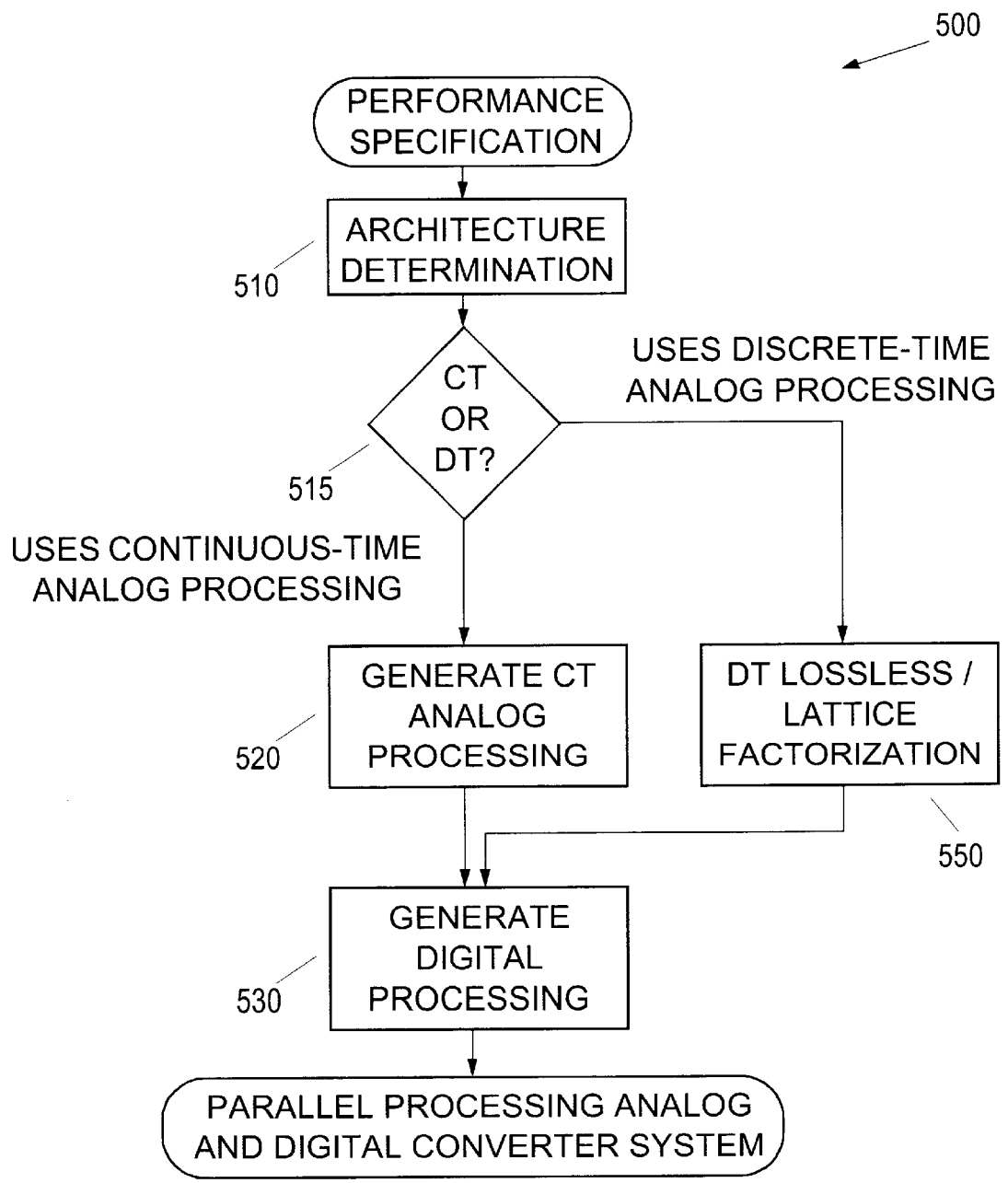
FIG. 6 is a flow chart showing a process for generating analog and digital converters in accordance with embodiments of the present invention.

A process 500 for generating (or designing) converters having the architecture shown in FIG. 3 will now be described with reference to FIG. 6 which shows a flow chart of the overall process 500. As shown in FIG. 6, the inputs to the process 500 are performance specifications and the output is an analog and digital converter system. In the description of process 500 that follows, reference is made to analog processing circuits and digital processing circuits. Depending on the architecture of the converter being designed, the digital processing circuits may be contained in either the decomposition section of the converter or the recombination section of the converter, and the analog processing circuits may be contained in either (or both in the case of an analog-to-analog converter) the decomposition section of the converter and the recombination section of the converter. For example, in the analog-to-digital converter 200 shown in FIG. 4, the decomposition section 120 contains analog processing circuits and the recombination section 160 contains digital processing circuits.

The first step 510 in the generation process 500 is to determine the desired architecture of the system. Once the architecture has been selected, then in decision block 515, a decision is made whether to use continuos-time analog signals or discrete-time analog signals. If discrete-time analog signals are selected, then in step 550, discrete-time lossless lattice factorization is used to generate the discrete-time analog processing circuits. If continuous-time analog processing is selected in decision block 515, then in step 520, continuous-time analog processing circuits are generated. After step 520 or 550, the digital processing circuits are generated in step 530.

Each of the steps in the process 500 will now be described in greater detail. To determine the architecture, the following parameters are considered: type of converter being designed, the number of channels and oversampling rate of the system; the frequency bandwidth, center frequency and stopband attenuation of the filters (for example, filters 230 and 260 of the converter 200); the degree of phase linearity of the filters; impedance matching; reflection; and isolation.

The number of channels and oversampling rate of the system can be determined by the desired performance and the performance capabilities of the converters chosen for use in the converter array 140. An M-channel system with no oversampling can provide resolution equivalent to that provided by each of the converters in the converter array with a sample rate increased by M times. Oversampling can be used to increase the resolution by reducing the effective sample rate of the system.

The frequency bandwidth of the filters can be determined, for example, to be 1/M times the effective Nyquist rate of the overall system. The bandwidths of the filters may be individually adjusted if applications, such as audio processing, require non-uniform channel bandwidths.

The center frequencies for the filters can be chosen to capture a desired portion of the frequency band and do not necessarily need to capture the baseband Nyquist zone. Intermediate frequency (IF) components in the second or third Nyquist zone may be captured, for example, to eliminate the need for another mixing stage to shift data down to baseband.

The stopband attenuation for the filters can be determined based on the required level of channel separation. For example, filter stopband attenuation should be large if subband processing is to be employed. The filters also attenuate effects of mismatches in the converter array, so the expected level of the residual frequency-dependent mismatch errors after compensation in the compensation circuitry 250 is also considered in determining how much, if any, stopband attenuation is necessary. The mismatches in the converter array cause aliasing errors which limit the resolution of the system. The effect of the mismatches can be quantified by calculating the spurious free dynamic range (SFDR) of the system, which is directly related to the resolution of the system. For example, the SFDR for a converter system with gain mismatches is provided by equation (9):

$$SFDR = \frac{1}{E\{\hat{a}^2\}2(stopband)^2} \qquad (9)$$

In equation 9, $E\{\hat{a}^2\}$ is the expected value of the residual gain mismatch error after compensation. For a desired resolution (SFDR), equation (9) can be solved to determine the required stopband attenuation.

The degree of phase linearity of the filters can be specified, for example, if subband processing that is sensitive to phase is to be employed.

Impedance matching, reflection, and isolation are important parameters to consider to minimize crosstalk errors that can introduce noise into the system and to insure efficient power splitting and power transfer to each of the channels. The input and output impedance is determined, for example, by the network input or output impedance to which the system interfaces.

Figure 7:
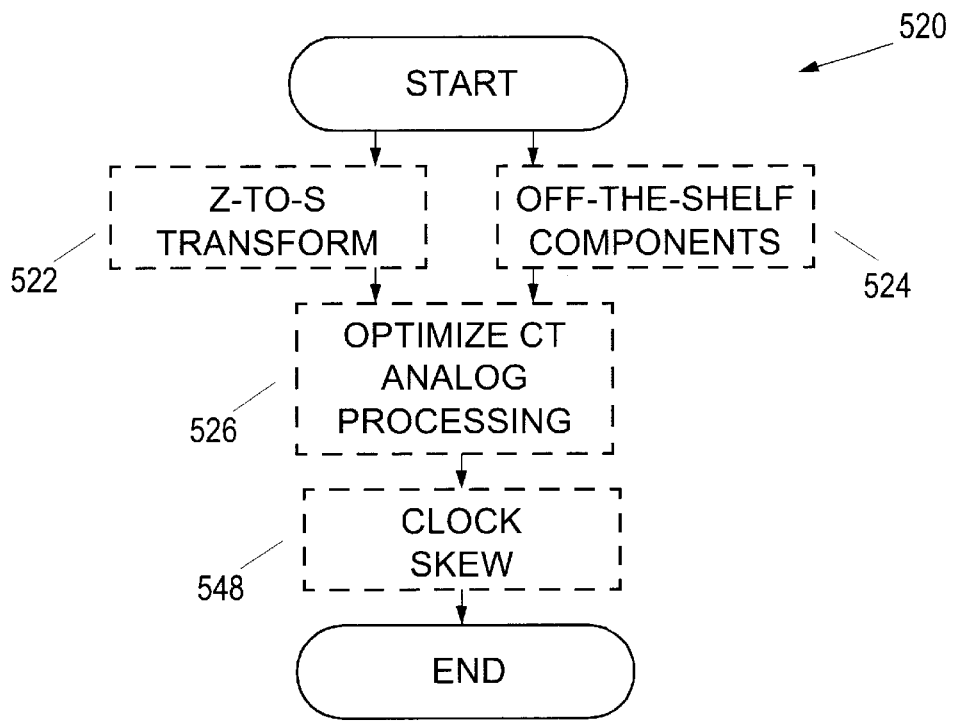
FIG. 7 is a flow chart showing a step for generating an analog processing section of FIG. 6 in greater detail.

In different embodiments of the present invention, one of four methods, or a combination of the methods can be used to generate the continuous-time analog signal processing circuits in step 520. These methods include: (1) an off-the shelf method; (2) a method utilizing a transform of a digital solution into continuous-time analog processing; (3) an optimization method; and (4) a clock skew method. A process for combining the four methods to accomplish step 520 is shown in FIG. 7. As shown in FIG. 7, either step 522 can be chosen to use method (2) to generate analog filters or step 524 can be chosen to use method (1) to generate analog filters. Next, in step 526, an optimization of the analog processing circuitry may be accomplished using method (3). Finally, in step 528, method (4) can be used to provide clock skewing. Each of the four methods will be described below in greater detail.

In the first method (step 524), standard analog filters such as Butterworth inductor-capacitor ladders can be used as the circuitry for the continuous-time analog processing circuits. These filters can be designed using known design techniques.

In the second method (step 522), a discrete-time solution is transformed into the continuous-time domain. Discrete-time filter bank solutions having the following properties are known: linear phase filters, alias cancellation, no distortion and no aliasing (i.e. perfect reconstruction), relatively low order filters, computationally efficient filter generation procedures, and non-uniform filter bandwidths. The transform described below yields stable continuous-time filters which match the frequency response of a discrete-time filter. To preserve the reconstruction accuracy in the generation of the system, accurate frequency response matching is critical.

A discrete-time to continuous-time (i.e., "Z-to-S") transform, $z^{-1}=G(s)$, in accordance with one embodiment of the present invention, converts a discrete-time filter, $H(z)$, into a continuous-time filter, $\hat{H}(s)$, whose frequency response, $\hat{H}(j\Omega)$ accurately approximates that of the discrete-time filter, $H(e^{j\omega})$. In one embodiment, the transform is a ratio of polynomials in s as shown in equation 10 below:

$$z^{-1} = G(s) = \frac{G_B(s)}{G_A(s)} \quad (10)$$

The accuracy of the approximation provided by equation (10) can be improved, for example, by increasing the order of the numerator and denominator polynomials, $G_B(s)$ and $G_A(s)$.

To generate the analog filters (230 or 360), first, a discrete-time filter bank is generated using standard generation techniques, such as those described by T. Q. Nguyen and R. D. Koilpillai in "The Theory and Design of Arbitrary-Length Cosine-Modulated Filter Banks and Wavelets, Satisfying Perfect-Reconstruction," in *IEEE Transaction on Signal Processing*, V44, N3 (March 1996). Second, the transform shown in equation (10) is used to calculate the required continuous-time filters. For example, the continuous-time analog to digital converter 200, shown in FIG. 4, can employ continuous-time filters (having a response equal to $\hat{D}_k(s)$) as the filters 230 in the decomposition section, that approximate their discrete-time counterparts (which have a response of $D_k(z)$), as shown in equation (11).

$$\hat{D}_k(s)=D_k(z)|_{z^{-1}=G(s)} \quad (11)$$

Similarly, the digital to continuous-time analog converter 300, shown in FIG. 4, can employ continuous-time filters (having a response equal to $\hat{R}_k(s)$) as the filters 360 in the recombination section 160, that approximate their discrete-time counterparts, (which have a response of $R_k(z)$), as shown in equation (12)

$$\hat{R}_k(s)=R_k(z)|_{z^{-1}=G(s)} \quad (12)$$

The Z-to-S transform used above will now be described further. In one embodiment, the transform $G(s)$ is used to directly calculate a continuous-time filter, $\hat{H}(s)=H(z)|_{z^{-1}=G(s)}$, whose frequency response accurately approximates that of a given discrete-time filter, $H(z)$, i.e. $\hat{H}(j\omega)\approx H(e^{j\omega})$. Alternatively, in another embodiment, transform $G(s)$ is calculated such that the error in the distortion and aliasing functions is minimized. In either embodiment, it is desirable for the resulting filter, $\hat{H}(s)$, to be stable. For example, one type of accurate $G(s)$ transform is a ratio of polynomials in s whose frequency response $G(j\Omega)$ approximates $z^{-1}=e^{-j\omega}$. One error criterion that can be minimized to provide an accurate transform is the mean-square error, as shown below in equation (13).

$$\epsilon_G(\omega)=|G(j\omega)-e^{-j\omega}|^2 \quad (13)$$

The order of the numerator and denominator, $G_B(s)$ and $G_A(s)$, can be specified independently. Higher order transforms improve the accuracy of the approximation, but increase the order of the resulting filter. For example, a fourth-order transform $G(s)$ (i.e., the highest order of $G_B(s)$ and $G_A(s)$ is 4) transforms an $n^{th}$ order discrete-time filter into a continuous-time filter of order 4n.

If $G(s)$ is a causal, stable, all-pass function then the transformed filters will be stable. Considering all-pass functions is natural since the frequency response of a desired transform is $e^{-j\omega}$, which has unity gain. The generation of all-pass transforms requires fewer optimization variables since the numerator and denominator of $G(s)$ are directly related (for example, for $G(s)$ with real coefficients, $G_B(s)=G_A(-s)$), as opposed to an unconstrained transform which allows the numerator and denominator functions to be chosen independently. The unconstrained transform may allow for greater accuracy with lower order filters, but it may yield unstable filters.

In the third method (step 526 of FIG. 7) used to generate the continuous-time analog signal processing circuits in step 520, the parameters of the analog filters are adjusted to meet the specifications and provide accurate reconstruction. Parameters that may be adjusted can include: poles and zero locations, filter order, component values (such as inductor or capacitors), cutoff slope, ripple, attenuation, phase linearity, or impedance (such as reflection coefficient).

In the fourth method (step 548 of FIG. 7) used to generate the continuous-time analog signal processing circuits in step 520, each of the channel converters in the converter array 140 samples its input signal using a unique sample clock. Altering the sample clocks can be used to compensate for phase mismatches or to improve reconstruction accuracy. The clock skew circuit 240 is used in one embodiment of an analog-to-digital converter to alter the response of the ADCs of the converter array such that the digital processing required to provide accurate reconstruction has a frequency response with conjugate symmetry. Digital filtering (filters 230 of converter 200) having real coefficients is more efficient than digital filtering having complex coefficients, and conjugate symmetry implies real coefficients.

Figure 8:
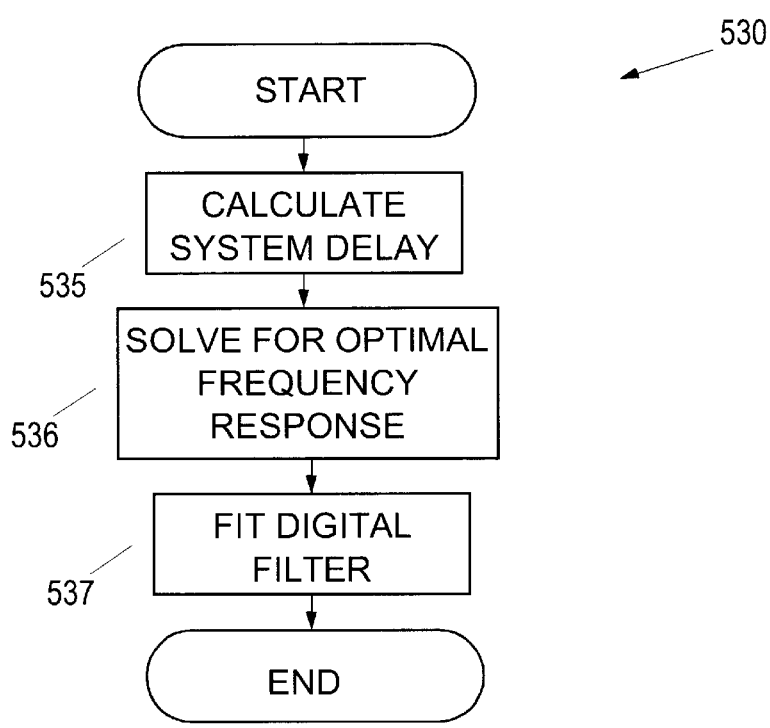
FIG. 8 is a flow chart showing a step for generating a digital processing section of FIG. 6 in greater detail.

The procedure by which the digital processing circuits (either the recombination circuit 160 of converter 200 or the decomposition circuit 120 of converter 300) are generated in step 530 of FIG. 6 will now be described with reference to FIG. 8 which shows the process for performing step 530 in greater detail. In embodiments of the present invention, the digital processing circuits approximate perfect reconstruction conditions, such that the distortion is small (e.g., less than a tenth of a dB deviation from ideal 0 dB) and the aliasing error does not limit the resolution of the system (e.g., 85–90 dB for a 14 bit system). For applications, such as in communications systems where dynamic range is important, errors in the distortion function (gain and phase linearity of the system) can be sacrificed for a reduction in the aliasing error.

In a first step 535 of the process 530, the system delay, d, is determined to alter the response of the digital signal processing such that the filters in the digital signal processing circuits have a frequency response with conjugate symmetry.

Given the analog filters generated using one of the methods described above, and the system delay, the frequency response of the digital filters used in the digital processing circuits are generated in step 536 to provide accurate reconstruction. For example, for the continuous-time analog to digital converter 200, given the system delay, d, and a response of $D_k(s)$ for the decomposition filters/splitters, the perfect reconstruction constraints in equation (8) can be solved for the frequency response, $R_k(e^{j\omega})$, of the ideal recombination filters. Equation (8) forms a set of M simultaneous equations linear in the M unknown recombination filters. The M simultaneous equations can be solved with standard linear algebra techniques. For example, the frequency responses of the ideal recombination filters for M=2 are shown in equations (14) and (15) below:

$$R_0(e^{j\omega}) = \frac{e^{-j\omega d}TD_1(j2(\omega - \pi)/T)}{D_0(j2\omega/T)D_1(j2(\omega - \pi)/T) - D_1(j2\omega/T)D_0(j2(\omega - \pi)/T)} \quad (14)$$

$$R_1(e^{j\omega}) = \frac{-e^{-j\omega d}TD_0(j2(\omega - \pi)/T)}{D_0(j2\omega/T)D_1(j2(\omega - \pi)/T) - D_1(j2\omega/T)D_0(j2(\omega - \pi)/T)} \quad (15)$$

In equations (15) and (16), $0 \leq \omega \leq \pi$, and T is the sample period of the ADCs in the converter array.

In step 537 of the process 530, the digital filters can be generated to match the desired frequency response calculated in step 536 as closely as possible. In one embodiment, the technique used for generating the digital filters is based upon the Fast Fourier Transform. The inverse Fast Fourier Transform is performed on samples of the desired frequency response. Then, the resulting impulse response is windowed to provide a finite-impulse response (FIR) filter accurately approximating the desired frequency response.

Using N samples of the frequency response of the ideal recombination filters (e.g., equations (14) and (15)), as shown below in equation (16), $$R_k(e^{j\omega})\Big|_{\omega=\frac{2\pi p}{N}}, \quad p = 0, 1, \ldots, N-1, \quad (16)$$

the N-point inverse FFT, $r_k^{(N)}[n]$, is the impulse response of the desired filter time-aliased every N points. In embodiments of the present invention, it is desirable to choose N to be large enough that the impulse response has sufficiently decayed so that time-aliasing is negligible (e.g., N=1024 points). However, a large value of N results in the N-point impulse response being extremely long. Accordingly, it is desirable to use a window function, w[n], with a length L to limit the impulse response as shown below in equation (17):

$$\hat{r}_k[n] = r_k^{(N)}[n]w[n] \quad (17)$$

In equation (17), L<N. In one embodiment, the boxcar function shown below in equation (18) is used as the window function:

$$w[n] = \{_{0, L \leq n \leq N}^{1, 0 \leq n \leq L-1} \quad (18)$$

The resulting $\hat{r}_k[n]$ are the length L finite impulse response filter coefficients that closely approximate the desired frequency response.

In embodiments of the present invention, error weighting can be used to trade off reconstruction accuracy in parts of the output frequency band that contain no useful energy (e.g., very low frequency portions of the band or very high-frequency portions of the band) in order to improve the accuracy in other parts of the output frequency band.

In other embodiments of the present invention, the desired frequency response of the digital filters can be based upon actual measurements of the analog signal conditioning, so that the digital filters can be used to compensate for phase or gain errors that actually occur in the analog circuitry.

Step 550 of process 500 will now be described in further detail. In step 550, a technique of lossless or lattice factorization of paraunitary filter banks is used to generate analog and digital converters that approximate the perfect reconstruction property while allowing for limited multiplier coefficient precision, limited internal precision, and clipping. This lossless lattice factorization technique is described further by P. P. Vaidyanathan, in *Multirate Systems and Filter Banks* (Englewood Cliffs, N.J.: Prentice-Hall, Inc. 1993), and by P. P. Vaidyanathan, T. Q. Nguyen, Z. Doganata and T. Saramaki, in "Improved Technique for Design of Perfect Reconstruction FIR QMF Banks with Lossless Polyphase Matrices," in *IEEE Transactions on Acoustics, Speech and Signal Processing* (July 1989).

An existing paraunitary perfect reconstruction digital filter bank (such as a cosine-modulated PR Filter Bank) is factored into lossless or lattice factors, each of which can be quantized to any precision without altering the perfect reconstruction property. The filter frequency responses can be approximations of the original unquantized filters with degraded stopband attenuation and passband ripple depending on the precision of the quantization.

The decomposition filters can be represented in the polyphase matrix form, as shown in equation (19) below:

$$\begin{bmatrix} D_0(z) \\ \vdots \\ D_{M-1}(z) \end{bmatrix} = \begin{bmatrix} E_{00}(z^M) & \cdots & E_{0,M-1}(z^M) \\ \vdots & \ddots & \vdots \\ E_{M-1,0}(z^M) & \cdots & E_{M-1,M-1}(z^M) \end{bmatrix} \begin{bmatrix} 1 \\ z^{-1} \\ \vdots \\ z^{-(M-1)} \end{bmatrix} \quad (19)$$

$$d(z) = \qquad E(z^M) \qquad e(z)$$

The matrix E(z) is the decomposition filter polyphase matrix. Vaidyanathan discloses a lossless factorization of an M×M causal, FIR paraunitary polyphase matrix that can be implemented with quantized coefficients without altering the paraunitary perfect reconstruction property as shown in equation (20):

$$E(z) = \alpha U_N(z) U_{N-1}(z) \ldots U_1(z) H_0 \quad (20)$$

In equation (20), $U_N(z)$ is a degree one, lossless M×M factor, and $H_0$ is an M×M unitary matrix. Each factor is implemented separately with quantized filter coefficients.

The resulting filters are implemented (for example, switched-capacitors or charge coupled devices) with finite-precision arithmetic, which can introduce distortion and aliasing errors. Finite-precision arithmetic causes arithmetic operations to be rounded to the internal wordlength of the implementation, an error which accumulates from stage to stage in the system. However, in embodiments of the invention, the error can be minimized to an acceptable level by using multiplicative gain normalization factors between each stage to maximize the dynamic range without overloading the signal.

In embodiments of the invention, the digital processing circuitry can be generated with an iterative optimization or a non-iterative optimization (as described above with reference to FIG. 8). The digital processing circuitry can be optimized to cancel imaging/aliasing, provide linear phase (not necessarily integer sample delay), nearly constant amplitude across frequency, or introduce minimal imaging/aliasing in the useful bandwidth (by using error weighting).

Another aspect of the present invention is directed to the process of calibrating analog and digital circuits having the architecture shown in FIG. 3. The calibration process involves measurement of the performance of the system to be calibrated followed by adjustment of the system to correct errors. In embodiments of analog and digital converters of the present invention, the following parameters may be adjusted to calibrate the converters: decomposition signal processing (section 120 of converter 100), compensation (compensation circuit 250 of converter 200 or compensation circuit 350 of converter 300), or recombination signal processing (section 120 of converter 100).

Figure 9:
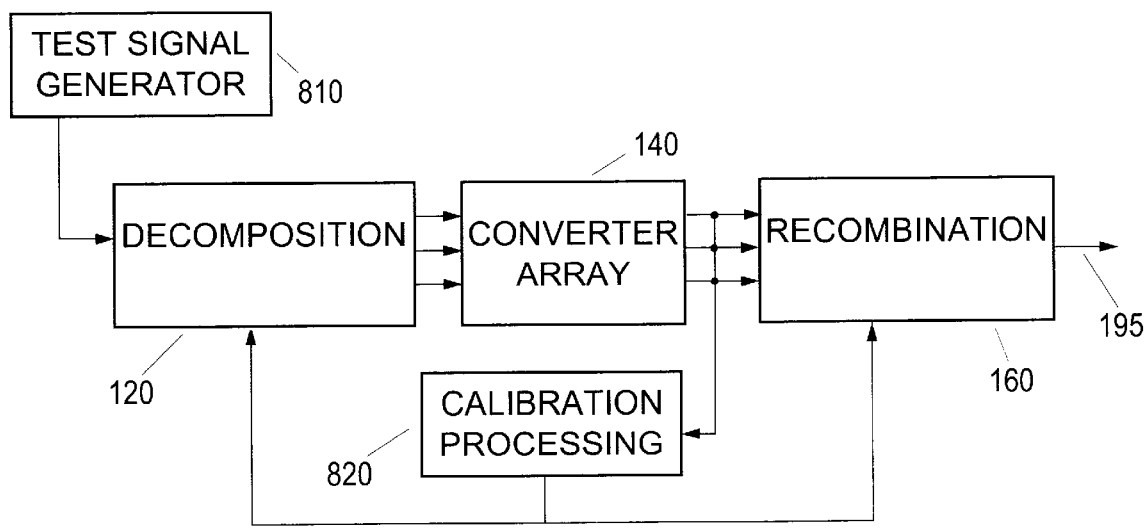
FIG. 9 shows a block diagram of a calibration setup used with embodiments of the present invention.
Figure 10:
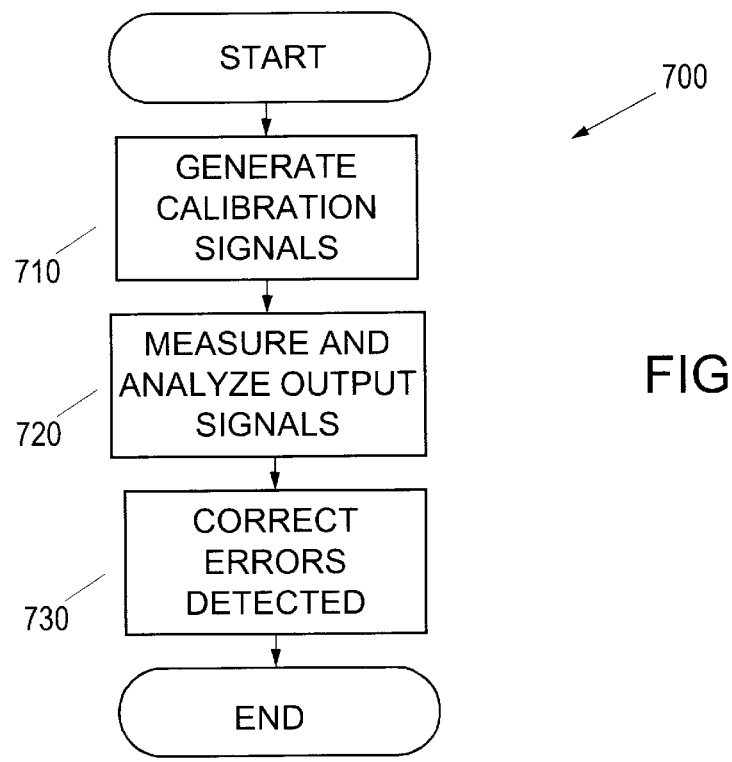
FIG. 10 shows a calibration process in accordance with one embodiment of the present invention.

One calibration process 700 will now be described with reference to FIGS. 9 and 10. FIG. 9 shows a block diagram of a calibration setup and FIG. 10 shows a flow chart of the calibration process 700. To perform the calibration of the converter 100, as shown in FIG. 9, a test signal generator 810 is coupled to the input of the converter, and a calibration processing analyzer 820 is coupled to the output of the converter array 140 and is coupled to the decomposition section 120 and the recombination section 160. In a first step 710 of the process 700, test signals are injected from test signal generator 810 into the converter 100 to characterize the performance. In step 710, a known signal or signals can be generated, and in step 720, resulting output signals are probed at various stages in the converter, using the calibration processing analyzer, to characterize errors such as gain, phase, DC-offset variation, noise, or harmonic distortion.

In embodiments of the present invention, to characterize the performance of the converter 100 across a wide frequency range, wideband test signals can be used. For example, in calibrating the analog-to-digital converter 200 of FIG. 4, a suitable calibration signal may be generated digitally and stored in a ROM (read only memory) of the test signal generator (or stored in a memory coupled to the test signal generator). The output of the ROM is then used as the input signal to a digital-to-analog converter (which may be included within the signal generator 810) to generate the calibration signal for the converter 200. The resulting analog test signal can be injected into the converter 200 to measure its performance.

One type of wideband test signal that can be used in embodiments of the present invention is a pseudo-random noise signal. The pseudo-random noise signal can be the summation of sinusoidal signals at several frequencies spanning the bandwidth of the system under test. Pseudo-random signals of this type are typically referred to as comb signals, where each sinusoidal frequency component of the signal is a "tooth" of the comb. Since converters in accordance with embodiments of the present invention employ multirate signal processing which due to rate changing, involves the generation of aliasing and imaging components, each tooth at a given frequency in a comb calibration signal can engender aliasing and imaging errors at other frequencies depending on the number of channels and the oversampling rate of the converters. To accurately resolve the origin and magnitude of these errors during calibration, the tooth frequencies are chosen in embodiments of the invention so they do not overlap the frequencies of possible aliasing and imaging error signals. In addition, the tooth frequencies are chosen in embodiments of the invention so as not to overlap harmonic distortion components or DC-offset error components.

Figure 11:
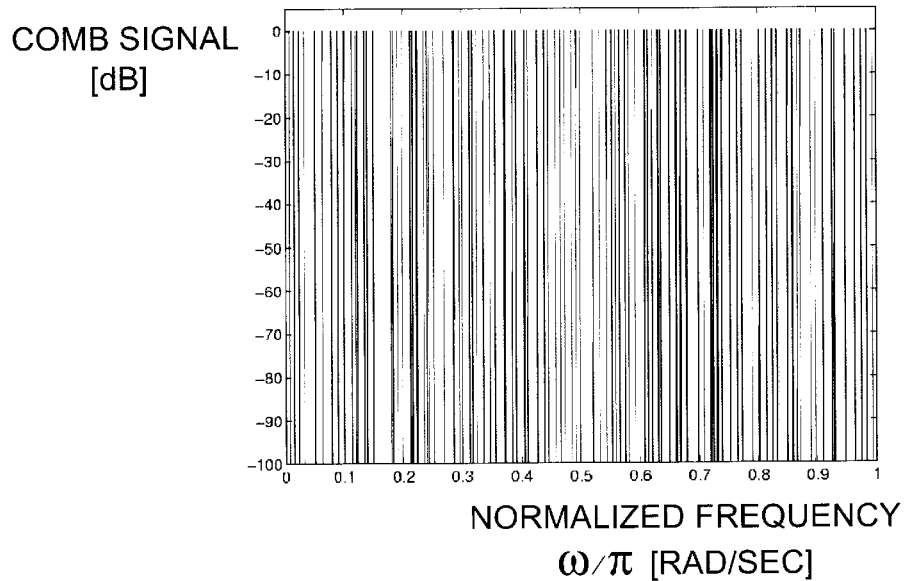
FIG. 11 shows the frequency spectrum of a calibration signal used in the calibration process of FIG. 10.

The phase of the tooth components of a comb calibration signal can be chosen to limit the time-domain amplitude of the comb calibration signal to allow accurate representation of the comb calibration signal in a finite-precision implementation (e.g., a ROM and a DAC). If the tooth components have coherent phase, the resulting calibration signal can have large amplitude peaks that require extended dynamic range to accurately generate the calibration signal. The phase of the teeth can be chosen to be non-coherent or random phase to minimize the time-domain peaks and allow for more accurate generation of the calibration signal in a finite-precision implementation. The frequency spectrum of one example of a desirable, non-uniform comb calibration signal, having 98 "teeth", used with embodiments of the present invention is shown FIG. 11.

In one embodiment of the present invention that utilizes a comb signal having the characteristics described above, in step 720 of the process 700, the output signals of each of the individual converters of the converter section 140 are measured and analyzed. Since the test signal is known, these channel signals can be compared with predicted ideal signals to determine errors such as DC-offset, time-delay, gain, phase, or harmonic distortion errors. The compensation circuits (either circuit 250 of converter 200 or circuit 350 of converter 300) and other circuits can be modified in step 730 to correct these errors. For example, a digital adder can be used to subtract off DC-offset; the clock-skewing circuit 240 can be used to correct time-delay; a digital multiplier can be used to correct for gain error; digital filters (260 or 330) can be used to correct frequency-dependent gain and phase error; static or dynamic linearity look-up tables can be used to correct harmonic distortion errors. If the comb signal described above is used as the calibration signal, each of the errors can be deduced separately (for example, using the discrete Fourier transform) and accurately since they occur at separate frequencies.

Figure 12:
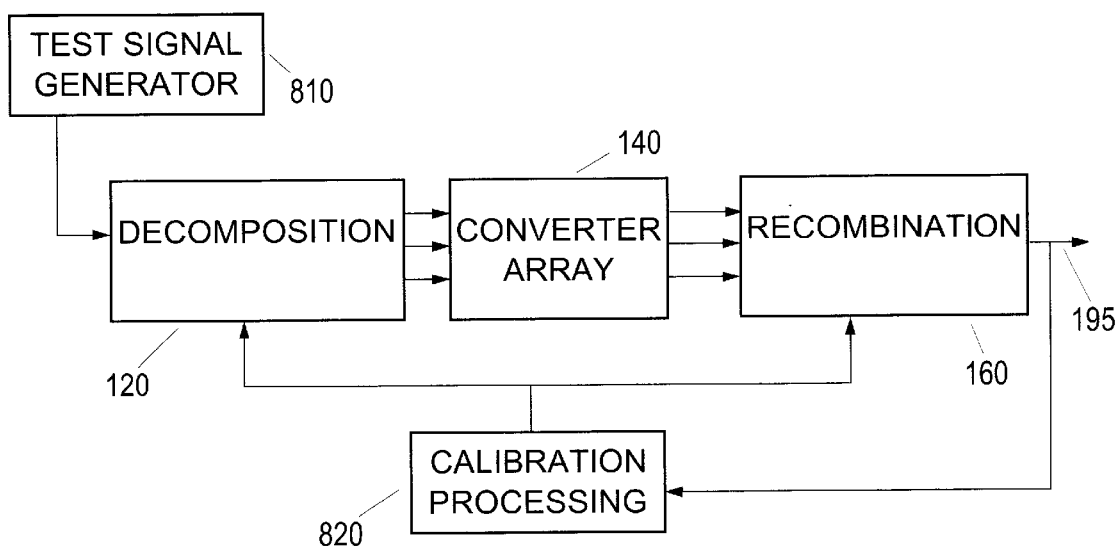
FIG. 12 shows a block diagram of another calibration setup used with embodiments of the present invention.

In another embodiment, during calibration, the calibration processing analyzer 820 can be coupled to the output of the recombination section 160 as shown in FIG. 12. In this embodiment, in step 720 of process 700, measurement and analysis of the single recombined system output signal is used to perform calibration. Since the calibration input signal is known, the system output signal can be compared with predicted ideal output signals to determine errors such as DC-offset, time-delay, gain, phase, or harmonic distortion errors. Any calibration errors detected can be corrected in step 730 of process 700 in the manner described above.

The calibration setup shown in FIG. 12 may require less hardware and less complex software for the calibration processing analyzer 820 than that required for the calibration setup shown in FIG. 10, since the system performance is measured using a single output signal rather than a plurality of output signals.

During step 730 of process 700, the compensation circuits may be optimized iteratively by repeatedly adjusting the compensation circuits and evaluating effects of the adjustment on the errors in the output signal. This iterative process may require less computational power than attempting to deduce the errors separately, which is important if frequent re-calibration is necessary and/or if the calibration processing analyzer is to be included with the converter itself.

In embodiments of the present invention, compensation circuits have been described as being physically located in decomposition sections or recombination sections of converters. In other embodiments, the functions of the compensation circuits may be included within the converter array 140, or the functions of the compensation circuits may be distributed among the decomposition section, the converter array and the recombination section.

In embodiments of the present invention discussed above, an adder is used to sum a plurality of signals to produce an output signal representative of an input signal to a converter. In other embodiments of the present invention, a converter does not include an adder, but rather, the output of the converter is a plurality of signals, which if summed, are representative of the input signal to the converter. In some applications requiring post converter processing, it is desirable to receive the plurality of output signals, rather than a sum of these signals, to simplify the post converter processing.

Embodiments of the present invention provide significant advantages and overcome drawbacks of the prior art. For example, embodiments of the present invention overcome the sensitivity to converter mismatches of prior art time-interleaved converters, and unlike the prior art system of U.S. Pat. No. 5,568,142, they overcome this sensitivity without requiring the use of high-order, high stopband attenuation filters. Embodiments of the present invention combine the benefits of time-division multiplexing with frequency-division multiplexing to provide accurate conversion with minimal computational requirements. In addition, embodiments of the present invention provide improved analog and digital converter generation and calibration techniques.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A converter for converting an input signal from a first format to a second format, the converter comprising:
   a decomposition section;
   a converter array operatively coupled to the decomposition section; and
   a recombination section operatively coupled to the converter array;
   wherein the decomposition section includes:
      an input to receive the input signal;
      a splitter to divide the input signal into a plurality of signals;
      a plurality of signal outputs, each of which provides as an output one of the plurality of signals; and
      a clock circuit having a plurality of clock outputs with relative phase delays for providing sample clocks to the converter array;
   wherein the converter array includes a plurality of converters, each of the converters having a signal input to receive one of the plurality of signals, a clock input to receive one of the sample clocks and an output that provides a converted signal;
   wherein at least one of the decomposition section and the recombination section includes filters for filtering either the plurality of signals or the plurality of converted signals; and
   wherein at least one of the filters includes an amplitude attenuator.

2. The converter of claim 1, wherein the first format is analog, the second format is digital, and each of the converters of the converter array is an analog to digital converter.

3. The converter of claim 1, wherein the recombination section includes a multiplexer for selecting an output signal from a plurality of signals to form a converter output signal, wherein the converter output signal is of the second format and is representative of the input signal.

4. The converter of claim 2, wherein the recombination section includes a compensation section that corrects errors introduced into the converted signals by the converters in the converter array.

5. The converter of claim 2, wherein the recombination section includes a compensation section that corrects errors introduced into the converted signals by the decomposition section.

6. The converter of claim 1, wherein the first format is digital, the second format is analog, each of the converters of the converter array is a digital to analog converter, the decomposition section includes a plurality of filters for filtering each of the plurality of signals, and the recombination section includes a plurality of filters for filtering each of the converted signals.

7. A method for converting an input signal from a first format to a second format, the method comprising steps of:
   receiving the input signal;
   splitting the input signal into a plurality of signals;
   generating a plurality of clock signals each having a clock period and a relative phase delay;
   converting the plurality of signals from the first format to the second format using a sampling rate determined by the clock period of the plurality of clock signals to produce a plurality of converted signals; and filtering the plurality of signals, the plurality of converted signals or both, wherein the step of filtering includes a step of adjusting the gain.

8. The method of claim 7, wherein the first format is analog, the second format is digital, and wherein the step of converting includes a step of converting the plurality of signals from analog to digital.

9. The method of claim 7, further comprising a step of multiplexing to select an output signal from a plurality of signals to form a converter output signal, wherein the converter output signal is of the second format and is representative of the input signal.

10. The method of claim 8, further comprising a step of correcting errors introduced into the converted signals during the step of converting.

11. The method of claim 8, further comprising a step of correcting errors introduced during the step of splitting.

12. The method of claim 8, further comprising a step of correcting errors introduced during the step of filtering.

13. The method of claim 7, wherein the first format is digital, the second format is analog, and wherein the step of converting includes a step of converting the plurality of signals from digital to analog.

* * * * *